(12) United States Patent
Shimizu et al.

(10) Patent No.: US 10,316,580 B2
(45) Date of Patent: Jun. 11, 2019

(54) OPENABLE/CLOSEABLE COVER DEVICE OF A CIRCUIT BOARD WORK MACHINE

(71) Applicant: FUJI CORPORATION, Chiryu (JP)

(72) Inventors: Toshinori Shimizu, Kariya (JP); Toshihiko Yamasaki, Nisshin (JP); Hiroyasu Ohashi, Toyota (JP); Masaki Murai, Nishio (JP)

(73) Assignee: FUJI CORPORATION, Chiryu (JP)

( * ) Notice: Subject to any disclaimer, the term of this patent is extended or adjusted under 35 U.S.C. 154(b) by 338 days.

(21) Appl. No.: 14/764,642

(22) PCT Filed: Jan. 31, 2013

(86) PCT No.: PCT/JP2013/052203
§ 371 (c)(1),
(2) Date: Jul. 30, 2015

(87) PCT Pub. No.: WO2014/118939
PCT Pub. Date: Aug. 7, 2014

(65) Prior Publication Data
US 2015/0368957 A1 Dec. 24, 2015

(51) Int. Cl.
*E06B 5/00* (2006.01)
*B41F 15/08* (2006.01)
(Continued)

(52) U.S. Cl.
CPC ............... *E06B 5/00* (2013.01); *A47B 81/00* (2013.01); *B41F 15/08* (2013.01); *E06B 3/5009* (2013.01);
(Continued)

(58) Field of Classification Search
CPC . E06B 5/00; E06B 3/52; E06B 3/5009; A47B 81/00; H05K 3/3484; H05K 3/1233
(Continued)

(56) References Cited

U.S. PATENT DOCUMENTS 1,471,781 A * 10/1923 Frederick ............... B65D 43/00
160/210
1,773,730 A * 8/1930 Hankins .................... E06B 3/50
49/152
(Continued)

FOREIGN PATENT DOCUMENTS

DE 10 2008 056 734 B3 7/2010
EP 0 995 941 A2 4/2000
(Continued)

OTHER PUBLICATIONS

Office Action dated Mar. 16, 2017 in Chinese Patent Application No. 201380071625.0 (English translation only).
(Continued)

*Primary Examiner* — Gregory J Strimbu
(74) *Attorney, Agent, or Firm* — Oblon, McClelland, Maier & Neustadt, L.L.P.

(57) ABSTRACT

A cover device which covers an upper part of a mounting work space of a component mounting machine includes: an openable/closable cover including a first cover portion swingable around a first swinging shaft line and a second cover portion attached to a free end of the first cover portion to be swingable around a second swinging shaft line; and a guiding device which stably holds the openable/closable cover in a half-opened state and in an entirely opened state. To hold the half-opened state of the openable/closable cover, a guide rail is provided with a downwardly curved portion at an intermediate portion of the guide rail, and a flip-up type guide provided above the curved portion.

4 Claims, 7 Drawing Sheets

(51) Int. Cl.
*A47B 81/00* (2006.01)
*E06B 3/50* (2006.01)
*H05K 13/08* (2006.01)
*H05K 3/12* (2006.01)
*H05K 3/34* (2006.01)

(52) U.S. Cl.
CPC ......... *E06B 3/509* (2013.01); *H05K 13/0888* (2018.08); *H05K 3/1233* (2013.01); *H05K 3/3484* (2013.01)

(58) Field of Classification Search
USPC ........................................ 160/210, 213, 206
See application file for complete search history.

(56) References Cited

U.S. PATENT DOCUMENTS

| | | | | |
|---|---|---|---|---|
| 1,945,729 A * | 2/1934 | Callender | ............... | E06B 9/063 160/206 |
| 2,946,304 A * | 7/1960 | Greer | ................... | B63B 19/203 114/202 |
| 3,022,818 A * | 2/1962 | Rolfe | ................... | E05D 15/264 16/96 R |
| 3,045,746 A * | 7/1962 | Henri | ................... | B61D 39/00 160/188 |
| 3,219,101 A * | 11/1965 | Henri | ................... | E04B 7/163 160/193 |
| 5,857,363 A * | 1/1999 | Jung | ................... | D06F 39/14 160/206 |
| 6,863,358 B2 * | 3/2005 | Beyer | ................... | E06B 3/482 312/297 |
| 2013/0087057 A1 | 4/2013 | Kondo et al. | | |
| 2014/0069285 A1 * | 3/2014 | Sato | ................... | B41F 15/0881 101/127.1 |

FOREIGN PATENT DOCUMENTS

| | | |
|---|---|---|
| JP | 6-8172 A | 1/1994 |
| JP | 2002-246795 A | 8/2002 |
| JP | 2003-89035 A | 3/2003 |
| JP | 2009-50977 A | 3/2009 |
| JP | 4551008 B2 | 9/2010 |
| JP | 2011-230353 A | 11/2011 |

OTHER PUBLICATIONS

International Search Report dated May 7, 2013, in PCT/JP2013/052203, filed Jan. 31, 2013.
Office Action dated Jul. 29, 2016 in Japanese Patent Application No. 2014-559431 (submitting English language translation only).
Office Action dated Dec. 12, 2016 in European Patent Application No. 13 873 180.7.

* cited by examiner

OPENABLE/CLOSEABLE COVER DEVICE OF A CIRCUIT BOARD WORK MACHINE

TECHNICAL FIELD

The present disclosure relates to an openable/closable type cover device which covers an upper part of a work space on a work machine main body of a circuit board work machine that performs work with respect to an electronic circuit board, such as a screen printer which prints a cream type solder paste on the electronic circuit board, a component mounting machine which mounts an electronic circuit component on the electronic circuit board, or an electronic circuit board inspection machine which performs inspection of the electronic circuit board which has the electronic circuit component mounted thereon.

BACKGROUND ART

JP-A-2011-230353 described below discloses an example of an openable/closable type cover device. The openable/closable type cover device covers an upper part of a printing work space of a screen printer, includes a first cover portion which is attached to a main body of a printer to be swingable around a first swinging shaft line, and a second cover portion which is attached to a free end of the first cover portion to be swingable around a second swinging shaft line which is parallel to the first swinging shaft line, and can open the printing work space upward by being in a two-folded state where the second swinging shaft line moves relatively upward with respect to the first swinging shaft line. The two-foldable type cover device has an advantage that an opening/closing operation while covering a wide work space is easily performed, compared to an integrated swinging type cover device in which an integrated cover swings around one swinging shaft line.

SUMMARY

Technical Problem

However, the inventors have found that there is a room for further improvement in the two-foldable type cover device described in JP-A-2011-230353. In a case where the work space is wide, it is not always necessary to open the entire upper part of the wide work space, and sometimes it is sufficient if only a part thereof is opened. Nevertheless, the inventors have found that, since the two-foldable type cover device described in JP-A-2011-230353 can be stabilized only in two states, including a state where the entire two-foldable type cover device is opened and a state where the entire two-foldable type cover device is closed, there are problems that an opening/closing operation which is more excessive than necessary is required, or the work space is opened too wide. The disclosure is based on this discovery, and a task of the disclosure is to improve the two-foldable type cover device of a circuit board work machine.

Solution to Problem

The above-described problem is solved by making the two-foldable type cover device of the circuit board work machine into a device which can stably hold at least one half-opened state in addition to an entirely closed state and an entirely opened state.

In the circuit board work machine, in many cases, it is sufficient if the two-foldable type cover device has one half-opened state, but if necessary, it is also possible to have two or more half-opened states which stably hold different levels of half-opening.

Note that, the above-described "can stably hold a half-opened state" means the cover device can maintain the half-opened state even when a person releases their hands from the cover device.

Advantageous Effects

In this manner, when the two-foldable type cover device of the circuit board work machine can stably maintain at least one half-opened state, in a case where only a part of a circuit board work space needs to be opened upward, an unnecessarily excessive opening/closing operation is not necessary, or it is possible to avoid the work space from being opened too wide, and thus, an effect in which usability of the two-foldable type cover device is improved is obtained. Since there are many cases where it is necessary to hold temperature or humidity of the work space in a set range in the circuit board work machine, the effect of avoiding the work space from being opened too wide is significant.

In addition, among a circuit board work device, when devices for which opening upwards is frequently necessary can be intensively disposed in a region which is opened upward when the two-foldable type cover device is in a half-opened state, in many cases, it is sufficient to make the two-foldable type cover device be in the half-opened state, thus it is possible to more effectively achieve the effect of the disclosure.

BRIEF DESCRIPTION OF DRAWINGS

FIG. 6 is a view illustrating an intermediate portion of a guide rail and a flip-up type guide which is provided in the vicinity thereof in a guiding device of the openable/closable type cover device.

DESCRIPTION OF EMBODIMENTS

Hereinafter, several embodiments of the disclosure will be described with reference to the above-described drawings. It should be noted that embodiments are non-limiting and can be embodied in various changed forms based on the knowledge of someone skilled in the art.

Figure 1:
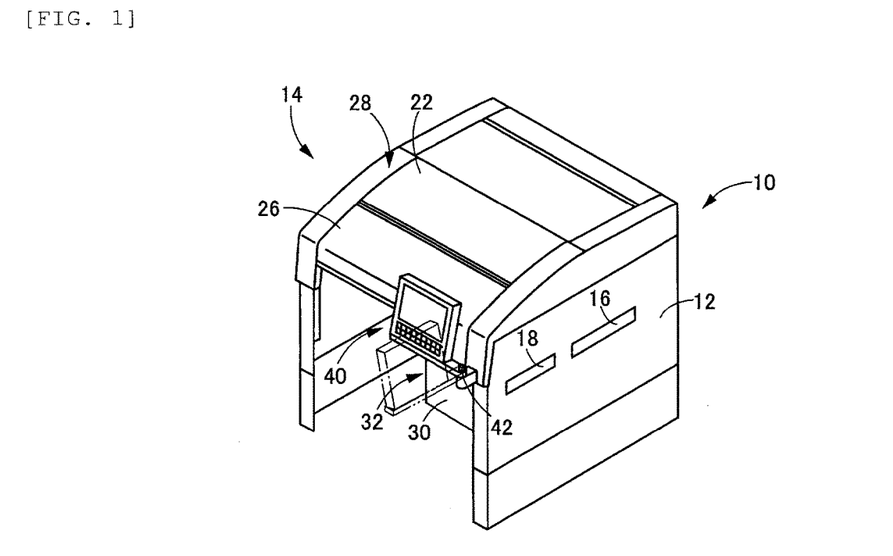
FIG. 1 is a perspective view illustrating a housing of a component mounting machine including an openable/closable type cover device.

FIG. 1 illustrates a housing 10 of a component mounting machine which mounts an electronic circuit component on a circuit board. The housing 10 includes a mounting machine main body 12 and an openable/closable type cover device (hereinafter, referred to as a cover device) 14. The component mounting machine is one type of a circuit board work machine which performs work with respect to the circuit board. An electronic circuit board manufacturing line which manufactures the electronic circuit board is configured such that the circuit board work machine, an additional component mounting machine, a screen printer which prints a cream type solder paste on the circuit board, an adhesive applying machine which applies an adhesive to the circuit board, and an electronic circuit board inspection machine which inspects an electronic circuit board, are disposed to be adjacent to the component mounting machine. For this reason, an opening 16 is formed on a side surface of the mounting machine main body 12, board conveyors are installed in two lanes in the front and the rear, passing through the opening 16, and the component mounting machine mounts the electronic circuit component on the circuit board which is conveyed by these board conveyors into a component mounting space which is one of the circuit board work spaces. In addition, a reference numeral 18 indicates an observation window which is closed by a transparent plate. The observation window 18 is for visually checking the inside of the mounting machine main body 12 in a state where an other circuit board work machine is not disposed to be adjacent to the component mounting machine.

Figure 2:
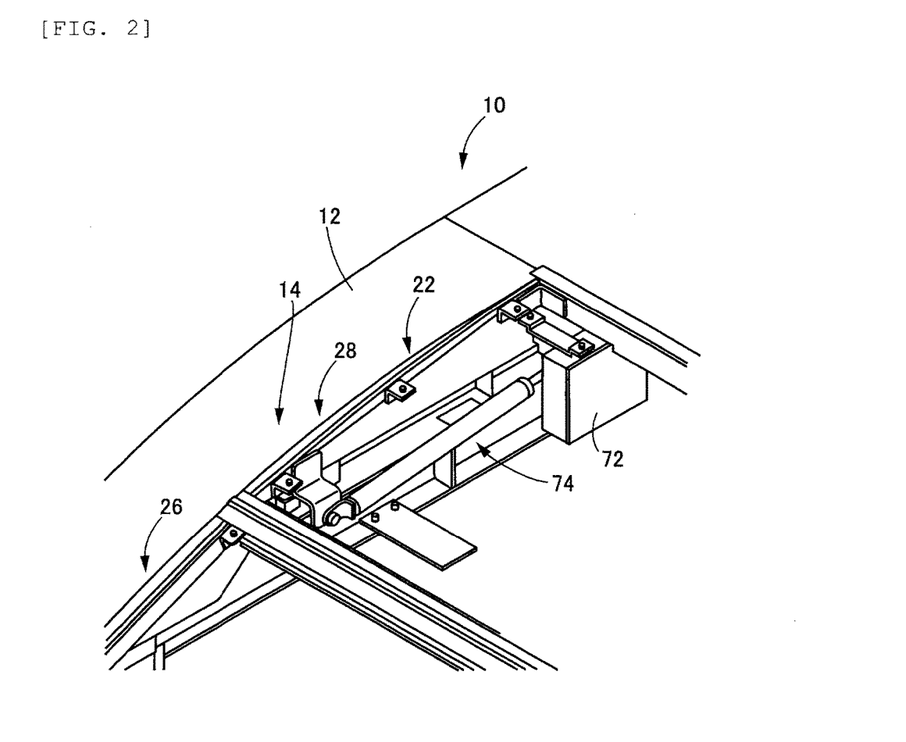
FIG. 2 is an enlarged partial view of the housing.
Figure 3:
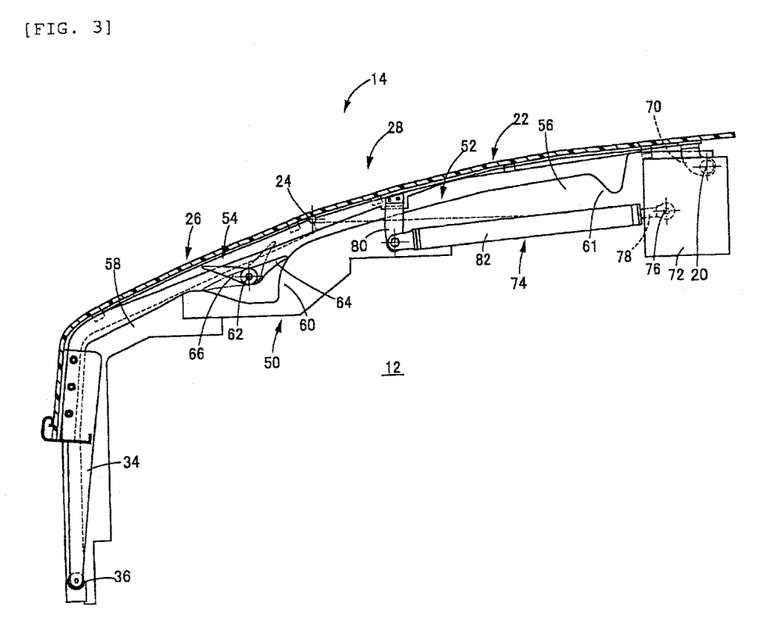
FIG. 3 is a side surface sectional view illustrating an entirely closed state of the openable/closable type cover device.
Figure 4:
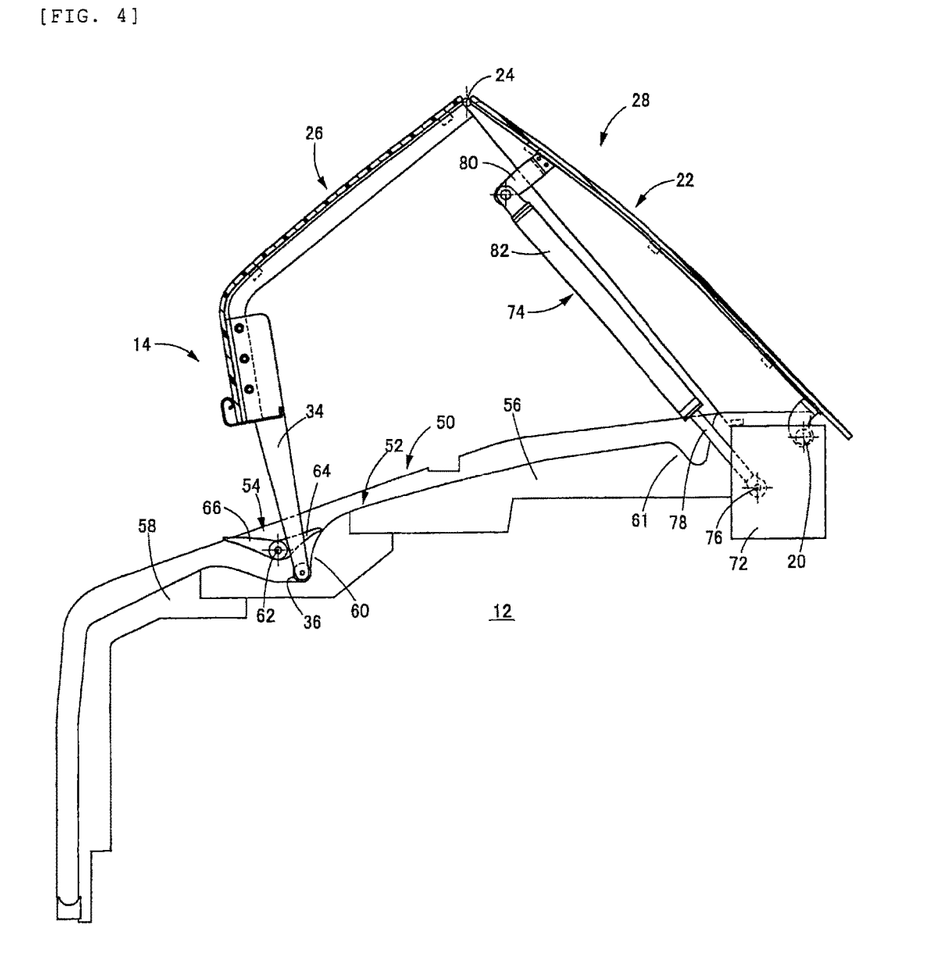
FIG. 4 is a side surface sectional view illustrating a half-opened state of the openable/closable type cover device.
Figure 5:
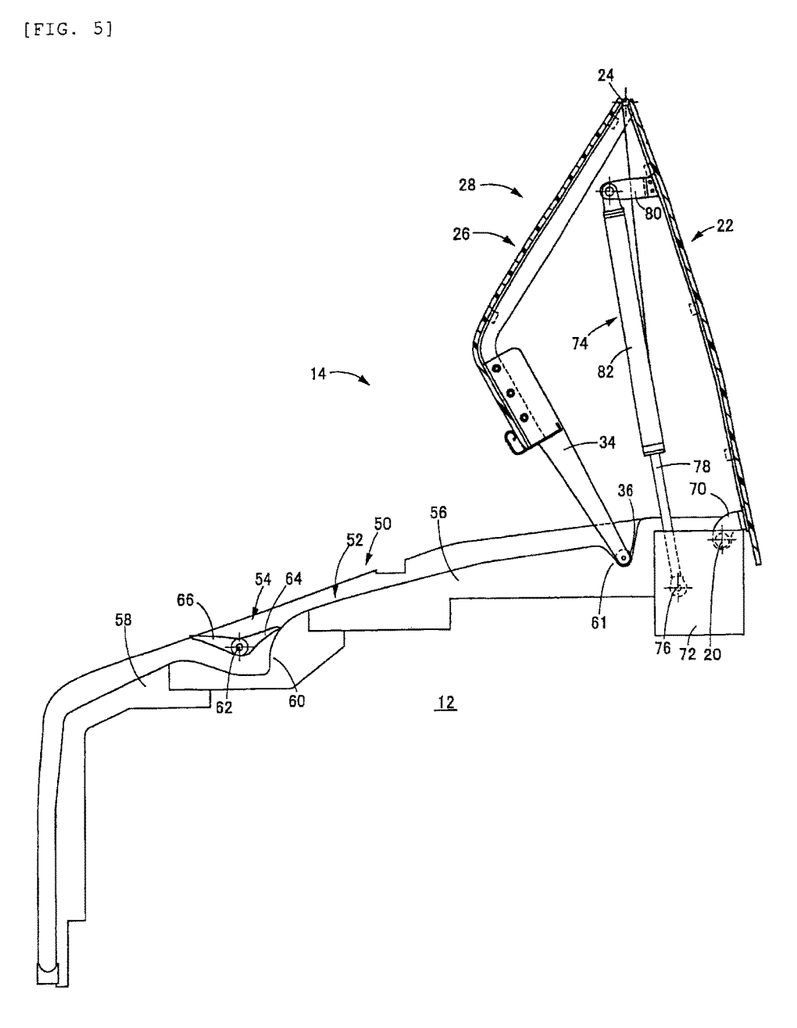
FIG. 5 is a side surface sectional view illustrating an entirely opened state of the openable/closable type cover device.

The cover device 14 is attached to the mounting machine main body 12 to be openable and closable in order to cover an upper part of the component mounting space, and as described in FIGS. 3 to 5, includes a first cover portion 22 which is attached to the mounting machine main body 12 to be swingable around a first swinging shaft line 20 which is parallel to a horizontal direction, and a second cover portion 26 which is attached to a free end of the first cover portion 22 to be swingable around a second swinging shaft line 24 which is parallel to the first swinging shaft line 20. Accordingly, as described in FIGS. 4 and 5, an openable/closable cover 28 of the openable/closable cover device 14 is a two-foldable type which can open the component mounting space upward in a two-folded state where the second swinging shaft line 24 moves relatively upward with respect to the first swinging shaft line 20. Both the first cover portion 22 and the second cover portion 26 are made of a transparent material, and even in an entirely closed state, the inside of the space can be seen through as illustrated in FIG. 2.

As apparently seen in FIG. 1, in the second cover portion 26, a cutout 32 is formed at a part except for a right corner portion 30 of a free end portion, and a component supply portion of a component supply section, such as a tape feeder or a tray feeder, which is not illustrated, can protrude into the component mounting space through the cutout 32. In addition, in a left end portion of the cutout 32, as illustrated in FIGS. 3 to 5, a holding arm 34 is fixed in a state extending parallel to the right corner portion 30, and each roller 36 (a roller of the right corner portion 30 is not illustrated in the drawing) is attached to a lower end of the holding arm 34 and the right corner portion 30 to be swingable around the horizontal swinging shaft line. In addition, as illustrated in FIG. 1, an operation device 40 having a display is installed in front of the right corner portion 30 of the cover device 14 which is in an entirely closed state. However, since the operation device 40 is held to be swingable around a perpendicular swinging shaft by a supporting shaft 42, the operation device 40 is withdrawn to a position which is illustrated with a two-dotted chain line as necessary, and it is possible to avoid interference of the second cover portion 26 or disturbance of an access of an operator to the component mounting space.

The cover device 14 is opened and closed while being guided by a guiding device 50 illustrated in FIG. 3 or the like. The guiding device 50 includes a guide rail 52 which is provided on a side wall inner surface of the mounting machine main body 12, and a flip-up type guide 54, the guide rail 52 is provided with an upstream side guide portion 56, a downstream side guide portion 58, and curved portions 60 and 61, and the roller 36 is supported and guided by each of upper surfaces thereof. The upstream side guide portion 56 is generally inclined downwards to a front portion, and the downstream side guide portion 58 also has a similarly inclined part. However, a front end portion is a steeply inclined portion which is nearly vertical. In addition, the curved portion 60 is provided as a part which is curved downward between the upstream side guide portion 56 and the downstream side guide portion 58, and the flip-up type guide 54 is provided to be swingable around a horizontal swinging shaft line 62 above an opening portion which is opened above the curved portion 60. The flip-up type guide 54 is provided with a first arm 64 and a second arm 66 on both sides of the swinging shaft line 62, and a free end of the first arm 64 is normally in a state continuous with the upstream side guide portion 56 from below by an elastic member, such as a torsion coil spring which is not illustrated; when being swung against the elastic force of an elastic member, a free end of the second arm 66 is in a state continuous with the downstream side guide portion 58 and supported by the downstream side guide portion 58 from below.

As illustrated in FIG. 3 and the like, in a curved arm 70, a base end portion of the first cover portion 22 is attached to a supporting member 72 which is fixed to the mounting machine main body 12 to be swingable around the horizontal first swinging shaft line 20, and an assisting cylinder 74 is also attached to the supporting member 72 to be swingable around the horizontal swinging shaft line 76. A piston rod 78 of the assisting cylinder 74 is linked to an arm 80 which is fixed to a part separated from the first swinging shaft line 20 of the first cover portion 22 to be relatively swingable. The assisting cylinder 74 is a cylinder in which gas is pressurized inside a cylinder tube 82, and the piston rod 78 is biased in a protruding direction by pressure of the gas. As apparently illustrated in FIGS. 3 to 5, while a force which is necessary for operating the cover device 14 from an entirely closed state to an entirely opened state decreases when approaching the entirely opened state, the assisting cylinder 74 is disposed to contract at the maximum when the cover device 14 is in the entirely closed state, and to extend at the maximum when the cover device 14 is in the entirely opened state. In other words, the assisting cylinder 74 is always biased in a direction in which the cover device 14 is opened, but the biasing force is set to be slightly smaller than the force which is necessary for opening the cover device 14, and as a result, the cover device 14 is always held in the entirely closed state, and the assisting cylinder 74 assists the operator to open the cover device 14 only with a small force. In addition, instead of the assisting cylinder 74, it is possible to use an assisting cylinder which has an elastic member, such as a compression coil spring, embedded therein, or an assisting device including an elastic member or a guiding device which can expand and contract.

When it is necessary to make the cover device 14 which is configured as described above be in a half-opened state, if the operator puts a hand at a tip end (a dedicated handle which is provided in the vicinity of the tip end may be employed) of the second cover portion 26 and pulls up the roller 36 while maintaining a motion of slightly pushing the roller 36 to the guide rail 52, the roller 36 is raised while being guided to an upper surface of the downstream side guide portion 58 and reaches the curved portion 60. At this time, since the second arm 66 is separated from the downstream side guide portion 58 in the flip-up type guide 54, advancement of the roller 36 to the curved portion 60 is not disturbed, the roller 36 falls into the curved portion 60, and further raising is hindered by a steeply raised part of the curved portion 60. Even when the operator releases hands from the tip end of the second cover portion 26 in this state, as the roller 36 is supported by the curved portion 60, the openable/closable cover 28 stably maintains a half-opened state illustrated in FIG. 4. Therefore, the operator can perform necessary work with respect to the front portion of a mounting work space. In the embodiment, in a state where the openable/closable cover 28 is opened halfway, upper parts of the component supply portion of the component supply section and the front portion of the work space which is near the component supply portion are opened, and thus, the operator can perform work with respect to these parts. Since a two-foldable type cover device in the related art cannot stably maintain a half-opened state, the device has to be always in the entirely opened state, a position of the tip end of the second cover portion in the entirely opened state becomes far, and in a state where the component supply section is set in the mounting machine main body, the operator is obstructed by the component supply section, cannot operate the tip end of the second cover portion, and has to remove the component supply section. Meanwhile, in the embodiment, while the component supply section is set in the mounting machine main body 12, it is possible to make the openable/closable cover 28 be in the half-opened state, and to perform work with respect to the front portion of the work space.

Figure 6A:
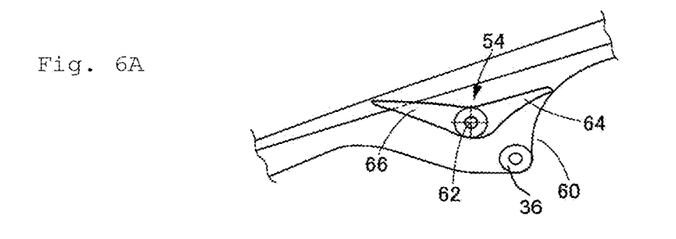
FIG. 6A illustrates a normal state.
Figure 6B:
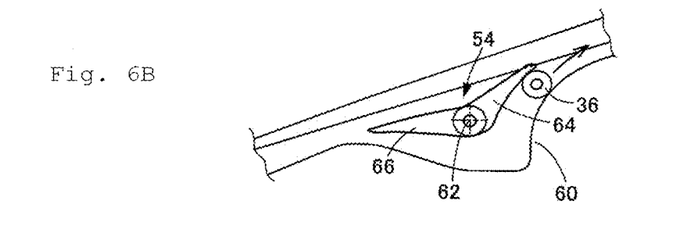
FIG. 6B illustrates a state where a roller is allowed to pass.

When it is necessary to access a much deeper part of the mounting work space, that is, a rear portion, the operator pulls the second cover portion 26 which is in a state of FIG. 4 further upward. Accordingly, the roller 36 flips up and detaches the first arm of the flip-up type guide 54 which is in a state of FIG. 6A from the curved portion 60 as illustrated in FIG. 6B, and becomes in a state of being guided on an upper surface of the upstream side guide portion 56. In addition, in a state where the roller 36 falls into the curved portion 61 illustrated in FIG. 5, even when the operator releases hands from the second cover portion 26, since the openable/closable cover 28 stably maintains the entirely opened state of FIG. 5, the operator can perform work with respect to the rear portion of the mounting work space. It is possible to perform work with respect to the two lanes of board conveyors and board holding devices which correspond thereto, and further, in the embodiment, it is possible to perform attaching and detaching work of a HEPA filter of an air cleaning device which is not illustrated and which is provided in an upper portion of the mounting work space.

Figure 6C:
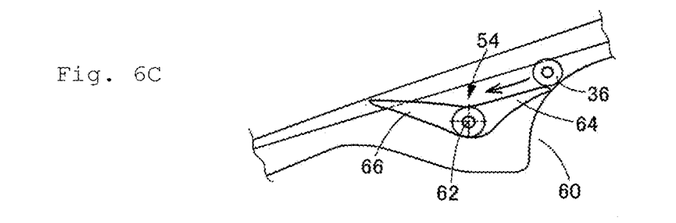
FIGS. 6C and 6D illustrate a state where the roller is bridged.
Figure 6D:
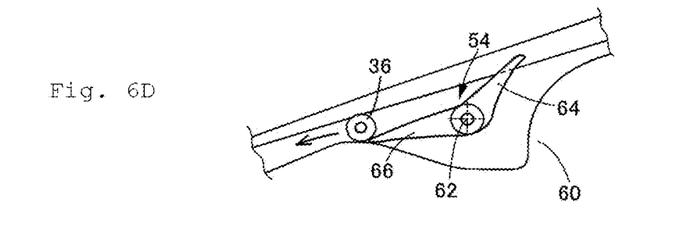

When returning the openable/closable cover 28 in the entirely opened state to the entirely closed state, the operator may simply pull the tip end forward after putting a hand to the tip end of the second cover portion 26 and pulling up the tip end. Accordingly, the roller 36 is guided to the upstream side guide portion 56 and reaches the upper part of the curved portion 60, but as illustrated in FIG. 6C, since the first arm 64 is in a state of being continuous with the upstream side guide in the flip-up type guide 54, the roller 36 does not fall into the curved portion 60. In addition, as illustrated in FIG. 6C, the roller 36 moves on the first arm 64, and soon reaches above the second arm 66. As a result, since the flip-up type guide 54 swings until a state illustrated in FIG. 6D is achieved against the elastic force of the elastic member, and the roller 36 is bridged to the downstream side guide portion 58, the openable/closable cover 28 can easily return to the entirely closed state.

In addition, in the description above, guiding of the roller 36 which is provided in the left end portion of the second cover portion 26 is described, but the guiding device of the roller 36 which is not illustrated and is provided in the right end portion is also configured similarly to the guiding device 50, and the roller 36 is similarly guided.

However, it is not essential to provide the roller and the guiding device thereof also in the right end portion of the second cover portion 26. For example, it is possible to omit the roller and the guiding device thereof when the width of the circuit board work machine is narrow, or when rigidity of the cover device is high.

In addition, in the above-described embodiment, the roller 36 is simply supported by a guiding surface of the guiding device 50. However, it is possible to provide a floating-up preventing member which is provided with a floating-up preventing surface which extends substantially parallel to each of the guiding surfaces except for the curved portion 60 of the guide rail 52, and the upper surface of the flip-up type guide 54 which is in a usual state, and to prevent the roller 36 from being excessively separated from the guide rail or the like.

In addition, when the free ends of the first arm 64 and the second arm 66 of the flip-up type guide 54 are supported by the upstream side guide portion 56 and the downstream side guide portion 58 from below, each of the arms 64 and 66 can easily be in a state of being continuous with each of the guide portions 56 and 58, but this is not essential. For example, a dedicated swing limit regulating device which regulates a swing limit in a forward direction of the flip-up type guide 54 and in a reverse direction thereto may be provided.

Furthermore, in order to make the first arm 64 be in a state of being usually continuous with the upstream side guide portion 56, using the elastic force or the like of the elastic member in the flip-up type guide 54 is desirable since a desirable state can be reliably maintained, but this is not essential. For example, by making the first arm 64 heavier than the second arm 66, the flip-up type guide 54 can usually be maintained in a state where the first arm 64 is continuous with the upstream side guide portion 56 by the difference in the swing moment between the first arm 64 and the second arm 66.

Figure 7:
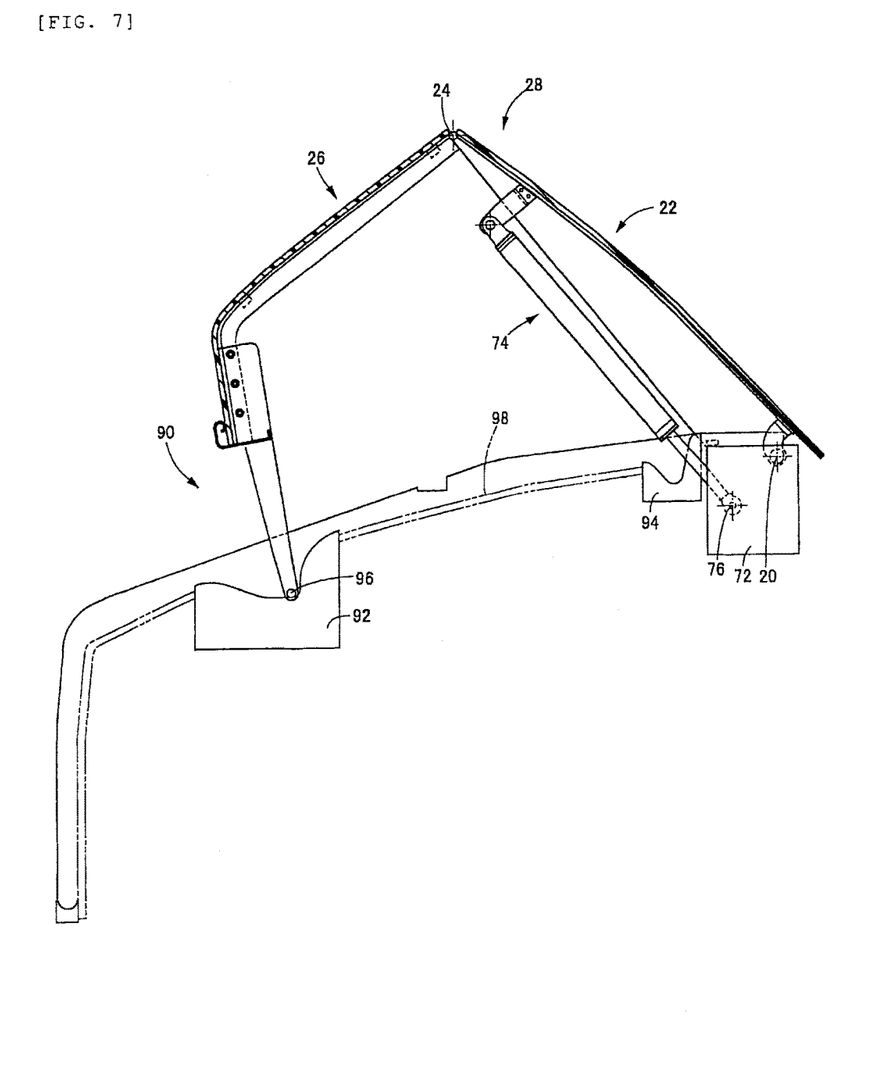
FIG. 7 is a side surface sectional view illustrating a half-opened state of the openable/closable type cover device which is another embodiment of the disclosure.

FIG. 7 illustrates a half-opened state of an openable/closable type cover device 90 which is another embodiment of the disclosure. Instead of the guiding device 50 in the previous embodiment, the cover device 90 is provided with supporting members 92 and 94 which stably support a free end of the second cover portion 26 in each of the half-opened state illustrated in the drawing of the openable/closable cover 28, and in the entirely opened state which is not illustrated. In the embodiment, the operator holds the tip end of the second cover portion 26 of the openable/closable cover 28 and makes the tip end be in the half-opened state or in the entirely opened state, and in this state, by supporting a supported pin 96 which is a supported portion provided in the second cover portion 26 by the supporting members 92 and 94, it is possible to stably hold the openable/closable cover 28 in the half-opened state and in the entirely opened state.

In addition, in this embodiment too, as illustrated with a two-dotted chain line, providing an excessive advancement preventing portion 98 which prevents the tip end of the second cover portion 26 from excessively advancing into the mounting work space is not essential, but there are many cases where this is effective.

Figure 8:
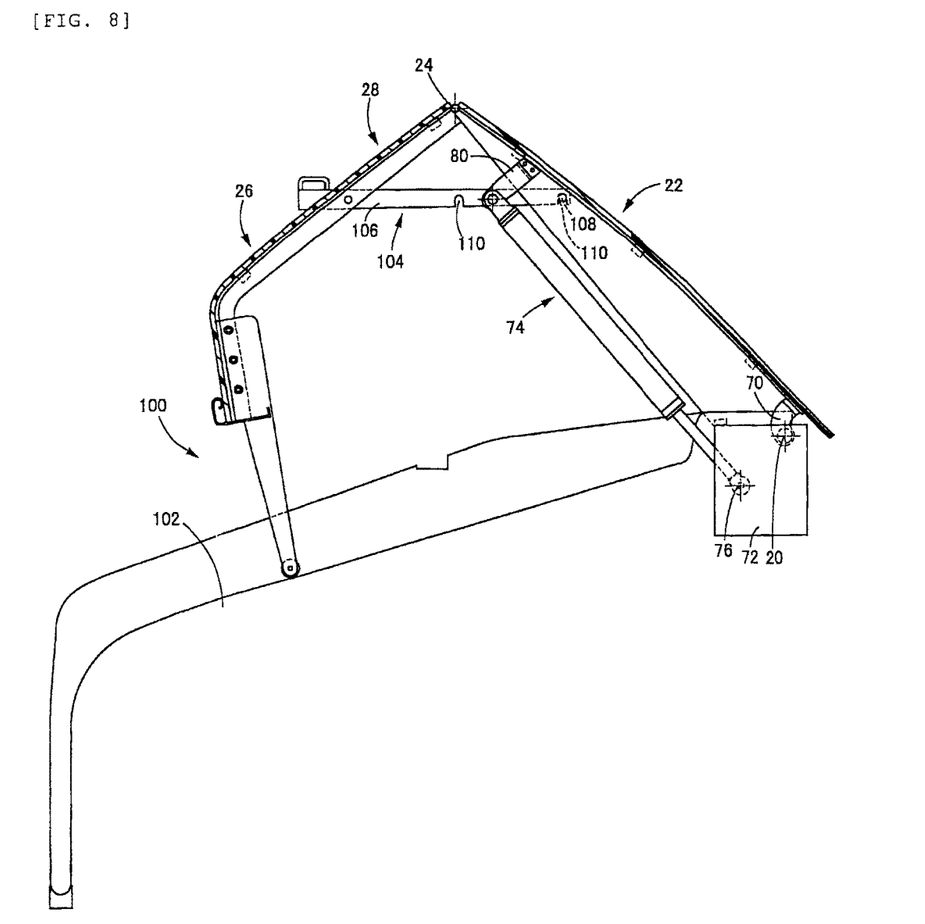
FIG. 8 is a side surface sectional view illustrating a half-opened state of the openable/closable type cover device which is still another embodiment of the disclosure.

FIG. 8 illustrates a half-opened state of an openable/closable type cover device 100 which is still another embodiment of the disclosure. The openable/closable type cover device 100 is provided with a guide rail 102 and a linking device 104 instead of the guiding device 50 in the previous embodiment. The guide rail 102 has a simple shape which does not have the curved portions 60 and 61 in the previous embodiment, and a function of holding the openable/closable cover 28 in the half-opened state and in the entirely opened state is achieved by the linking device 104. The linking device 104 is provided with a linking link 106 which is attached to the second cover portion 26 to be relatively swingable, and an engaged pin 108 which is an engaged portion provided in the first cover portion 22. As the linking link 106 is provided with an engagement cutout 110 which is an engagement portion at a plurality of locations (two locations in the example illustrated in the drawing) in a longitudinal direction, one of the plurality engagement cutouts 110 is engaged with the engaged pin 108, a relative swing position of the first cover portion 22 and the second cover portion 26 is fixed, and according to this, the openable/closable cover 28 is stably maintained in the half-opened state or in the entirely opened state.

REFERENCE SIGNS LIST

10: HOUSING, 12: MOUNTING MACHINE MAIN BODY, 14: OPENABLE/CLOSABLE TYPE COVER DEVICE, 20: FIRST SWINGING SHAFT LINE, 22: FIRST COVER PORTION, 24: SECOND SWINGING SHAFT LINE, 26: SECOND COVER PORTION, 28: OPENABLE/CLOSABLE COVER, 34: HOLDING ARM, 36: ROLLER, 50: GUIDING DEVICE, 52: GUIDE RAIL, 54: FLIP-UP TYPE GUIDE, 56: UPSTREAM SIDE GUIDE PORTION, 58: DOWNSTREAM SIDE GUIDE PORTION, 60, 61: CURVED PORTION, 62: SWINGING SHAFT LINE, 64: FIRST ARM, 66: SECOND ARM, 74: ASSISTING CYLINDER, 90: COVER DEVICE, 92, 94: SUPPORTING MEMBER, 94: SUPPORTED PIN, 100: COVER DEVICE, 102: GUIDE RAIL, 104: LINKING DEVICE

The invention claimed is:

1. A cover device which covers an upper part of a work space of a main body of a circuit board work machine, the cover device comprising:
a first cover portion which is attached to the work machine main body to be swingable around a first swinging shaft line; and
a second cover portion which is attached to a free end of the first cover portion to be swingable around a second swinging shaft line which is parallel to the first swinging shaft line,
wherein the cover device can be in an entirely closed state and a two-folded state,
wherein when the cover device is in the two-folded state in which the second swinging shaft line is above the first swinging shaft line, the cover device is in an entirely opened state or in a half-opened state such that the upper part of the work space is opened,
wherein the cover device further comprises a second cover portion supporting device which supports a free end of the second cover portion in the entirely opened state and in the half-opened state,
wherein the second cover portion supporting device includes a guide rail which is fixed to the work machine main body, and a guided portion which is attached to the free end of the second cover portion and guided by the guide rail,
wherein the guide rail includes a downwardly curved portion at an intermediate portion of the guide rail that is between an upstream end of the guide rail and a downstream end of the guide rail, and when the guided portion moves into the downwardly curved portion, the cover device is in the half-opened state,
wherein the guide rail includes an upstream side guide portion between the downwardly curved portion and the upstream end of the guide rail and a downstream side guide portion between the downwardly curved portion and the downstream end of the guide rail,
wherein the cover device includes a flip-up guide which is provided above the downwardly curved portion to be swingable around a horizontal shaft line, the flip-up guide includes a first arm and a second arm extending in opposite directions from the horizontal shaft line, and a free end of the first arm is aligned with the upstream side guide portion in a first state of the flip-up guide,
wherein when the cover device moves from the entirely closed state to the half-opened state, the guided portion moves from the downstream end of the guide rail into the downwardly curved portion,
wherein when the cover device moves from the half-opened state to the entirely opened state, the guided portion engages and swings the first arm while moving out of the downwardly curved portion to the upstream side guide portion, and
wherein when the cover device moves from the entirely opened state to the entirely closed state, the guided portion moves from the upstream side guide portion to the first arm of the flip-up guide where the first arm supports the guided portion in order to prevent the guided portion from moving into the downwardly curved portion and then the guided portion swings the second arm around the horizontal shaft line after the guided portion passes over the horizontal shaft line such that the flip-up guide guides the guided portion to the downstream side guide portion in a second state of the flip-up guide where the second arm is aligned with the downstream side guide portion and then the guided portion moves to the downstream end of the guide rail.

2. The cover device according to claim 1, wherein in the first state of the flip-up guide, the free end of the first arm is supported by the upstream side guide portion, and in the second state of the flip-up guide, a free end of the second arm is supported by the downstream side guide portion.

3. The cover device according to claim 1, further comprising:
an elastic member which biases the flip-up guide toward the first state of the flip-up guide.

4. The cover device according to claim 1, further comprising:

a biasing device which biases the first cover portion and the second cover portion toward the two-folded state.

\* \* \* \* \*